United States Patent [19]

Farnworth et al.

[11] Patent Number: 4,906,314
[45] Date of Patent: Mar. 6, 1990

[54] PROCESS FOR SIMULTANEOUSLY APPLYING PRECUT SWATCHES OF PRECURED POLYIMIDE FILM TO EACH SEMICONDUCTOR DIE ON A WAFER

[75] Inventors: Warren M. Farnworth, Nampa; Alan G. Wood, Boise, both of Id.

[73] Assignee: Micron Technology, Inc., Boise, Id.

[21] Appl. No.: 292,118

[22] Filed: Dec. 30, 1988

[51] Int. Cl.⁴ ........................................... B32B 31/04
[52] U.S. Cl. .................... 156/230; 156/238; 156/249; 156/252; 156/253; 156/261; 156/267
[58] Field of Search .............. 156/252, 253, 261, 267, 156/230, 238, 249

[56] References Cited

U.S. PATENT DOCUMENTS

| | | | |
|---|---|---|---|
| 2,303,346 | 12/1942 | Flood | 156/267 |
| 3,711,625 | 1/1973 | Dupuis | 156/261 |
| 3,978,578 | 9/1976 | Murphy | 427/240 |
| 4,482,874 | 11/1984 | Rubertus et al. | 156/267 |
| 4,687,693 | 8/1987 | Sheyon et al. | 428/148 |
| 4,761,335 | 8/1988 | Aurichio et al. | 428/448 |

Primary Examiner—Caleb Weston
Attorney, Agent, or Firm—Angus C. Fox; Stan Protigal; Jon Busack

[57] ABSTRACT

A process for simultaneously applying precut protective swatches of precured polymer film to each semiconductor die on a wafer, whereby an indexed greater-than wafer-width strip of precured polyimide film having a heat-attach adhesive on its lower surface is die punched to remove essentially half of the scrap film, material between each of the individual portions on the film which dimensionally correspond to the areas of individual dies on a silicon wafer requiring protection. Each punched area corresponds to areas on the wafer die matrix that are to remain unprotected. Following this first punching, a strip of dimensionally-stable backing paper coated with heat-release adhesive is bonded to the upper surface of the polyimide strip in the region which will become matrices of swatches. The double layer strip is then subjected to second die-punch process which removes the remaining scrap film material between the individual swatches. Since the paper has been punched only once, the individual swatches—which are no longer continuously joined—are held in proper position by the paper backing strip. The double-layer strip is then wound onto a supply reel. The strip is then fed, on indexed rollers through an optically-aligning wafer positioning machine. When an entire wafer-size matrix arrives at the attachment location, the strip stops moving, at which point the machine optically positions a wafer immediately below the matrix, using the fiduciary marks on the wafer as reference points. A heated roller or pad presses the strip against the wafer, attaching the swatches comprising the matrix to each of the dies on the wafer and releasing the backing strip. The bare backing strip is wound up on a take-up reel as subsequent matrices move sequentially to the attachment position.

12 Claims, 2 Drawing Sheets ial on its lower surface, is fed from a supply reel into a...

PROCESS FOR SIMULTANEOUSLY APPLYING PRECUT SWATCHES OF PRECURED POLYIMIDE FILM TO EACH SEMICONDUCTOR DIE ON A WAFER

FIELD OF THE INVENTION

This invention is related to the fabrication of semiconductor devices. More specifically, it is related to a process for simultaneously applying precut protective swatches of precured polyimide film to each semiconductor die on a wafer.

BACKGROUND OF THE INVENTION

The use of polymer films on semiconductor dies as an alpha-particle barrier and as a mechanical insulation layer between the die and the encapsulating material is well known in the art. The upper surface of a semiconductor die is highly vulnerable to mechanical damage during the fabrication process. The sooner a die is covered with a protective coating, such as a layer of polyimide film, the sooner it will be protected against circuit discontinuities and row and column shorts (typically caused by a scratch or foreign particle on the die's upper surface).

The conventional technique for creating a protective polyimide film on the upper surface of a semiconductor die begins by depositing a drop of liquid polyamic acid on the upper surface of each die after it has been attached to one of the die-mounting pads of a leadframe strip and gold wires have been bonded between the connector pads on the die and the corresponding connector pads of the associated leadframe. If the correct amount of liquid has been deposited on the die, it will be dispersed over the die surface, but surface tension will prevent it from spilling over the edge of the die. The liquid polyamic acid is then cured in an oven at temperatures in the 300-degree-Centigrade range, thus polymerizing to form a tough protective polyimide film on the surface of the die.

The process of applying liquid polyamic acid to the die surface is fraught with problems. If too little polyimide is deposited on the die, it will lack sufficient protection against both data-destroying alpha-particle radiation and mechanical damage caused by the encapsulating material rubbing against the surface of the die as the two materials expand and contract at different rates as temperature varies. If too much polyimide, surface tension of the liquid will be insufficient to prevent it from running over the edge of the die, resulting in a film on the surface of the die that is too thin. There are also two problems associated with the high temperatures of the polymerization process. Firstly, the bonding wires quickly become annealed (soft) and have a tendency to become displaced as liquid plastic flows over them during the die encapsulation process. Such displacement may be severe enough to cause the wires to short out against the edge of the die. Secondly, it has been discovered that the heating of the die during the polymerization process permanently degrades performance of the chip.

Recognizing the advantage of protecting semiconductor dies early in the fabrication process (prior to wafer sawing, die attachment and wire bonding processes), New Long Corporation of Japan has developed a fully-automated screen printer for applying polyamic acid to all the dies on a wafer simultaneously. The printer, known as the New Long LS-15TVF, employs a dual camera system for aligning a printing screen with the fiduciary marks on a wafer. Although the process definitely represents a quantum advance in the art, there are a number of problems associated with screen printing. Firstly, as with the conventional technique, the liquid requires curing in an oven, which may lead to decreased reliability of the die. Secondly, the viscosity and rheology of the liquid must be maintained in a narrow range for the process to work properly. And thirdly, the maximum thickness of a polyimide layer applied to a wafer by a screen-print process followed by oven curing is approximately 50 microns. For certain applications, polyimide layers of double that thickness are required, making the screen-print process unusable.

SUMMARY OF THE INVENTION

The objective of the present invention was to create a process for applying precured polyimide swatches (especially those having thicknesses greater than 50 microns) to each die on a wafer simultaneously, taking advantage of existing equipment as far as possible and without creating a need for the development of an inordinate amount of new equipment for implementation of the process.

The foregoing objective has been accomplished by the development of a process for creating accurately-positioned wafer-size matrices of non-contiguous polyimide swatches attached on their upper surfaces to a periodically-indexed strip of dimensionally-stable backing material with heat-release adhesive. The lower surface of each swatch is coated with heat-attach adhesive. The strip is then wound onto a supply reel. The strip is then fed, on indexed rollers through an optically-aligning wafer positioning machine. When an entire wafer-size matrix arrives at the attachment location, the strip stops moving, at which point the machine optically positions a wafer immediately below the matrix, using the fiduciary marks on the wafer as reference points. A heated roller or pad presses the strip against the wafer (alternatively, the wafer itself may be heated), attaching the swatches comprising the matrix to each of the dies on the wafer and releasing the backing strip. The bare backing strip is wound up on a take-up reel as subsequent matrices move sequentially to the attachment position.

PREFERRED EMBODIMENT OF THE INVENTION

Figure 1:
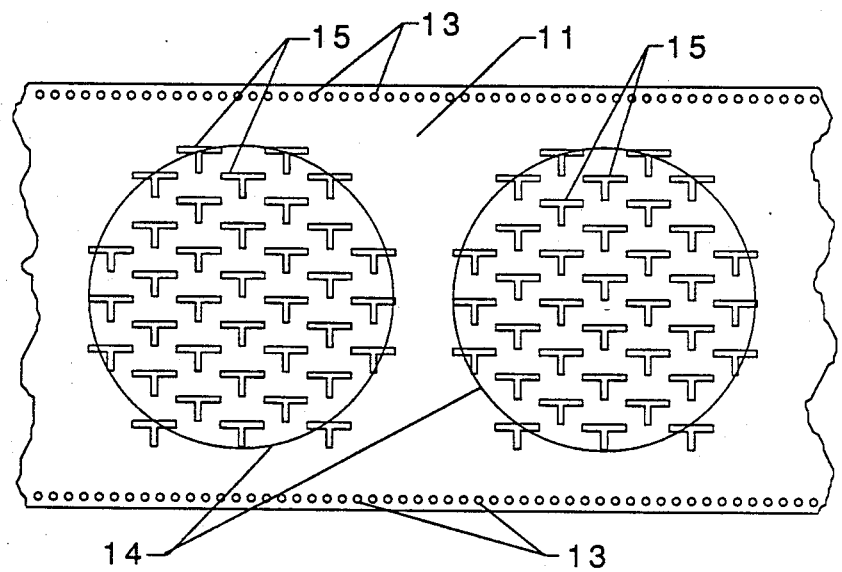
FIG. 1 is a top plan view of a polyimide strip following an index die punching on both edges and a first matrix die punching in the center region.

Referring now to FIG. 1, a strip of precured polyimide film 11, approximately 40 mm wider than the wafer diameter, and having a heat-attach adhesive coating on its lower surface (not shown in this view), is die punched with periodic index holes 13 along both edges. Following the indexing process, strip 11 is subjected to a second die punching operation whereby half the scrap film material, between what will become the individual swatches within the wafer-diameter areas 14 on the film, is removed. To produce rectangular swatches, the scrap material is removed in the form of "T"-shaped punchings 15. More complex die-punch patterns are required for swatches which deviate from the rectangular format. Although more than 1,000 semiconductor dies may be present on a 150 mm (6-inch)-diameter silicon wafer, strip 11 is shown punched for a wafer having far fewer dies in order to simplify the drawings.

Figure 2:
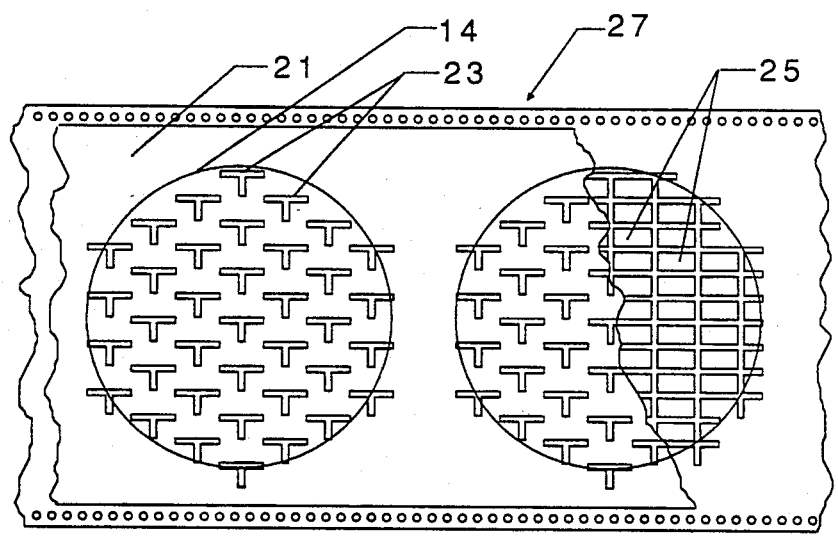
FIG. 2 is a partially cut-away top plan view of the polyimide strip of FIG. 1, following the bonding thereto of a dimensionally-stable paper backing strip and a third die punching.

Referring now to FIG. 2, a dimensionally-stable paper backing strip 21, approximately 20 mm wider than the wafer diameter in width, is bonded to the indexed and "T"-punched strip 11 of FIG. 1 with heat-release adhesive (not shown in this view). Strip 11 is then subjected to a third die punching operation whereby the remaining scrap film material, between the individual swatches within the wafer-diameter areas 14 on the film, is removed. This third die punching also removes scrap film material in "T"-shaped sections 23. The removal of punching 15 and sections 23 has created matrices of non-contiguous swatches 25 in each of the wafer-diameter areas which correspond to portions of dies to be covered on a particular wafer. Each of the swatches is still attached to backing strip 21. The completely punched multi-layer strip shall be referred to hereinafter as matrix strip 27.

Figure 3:
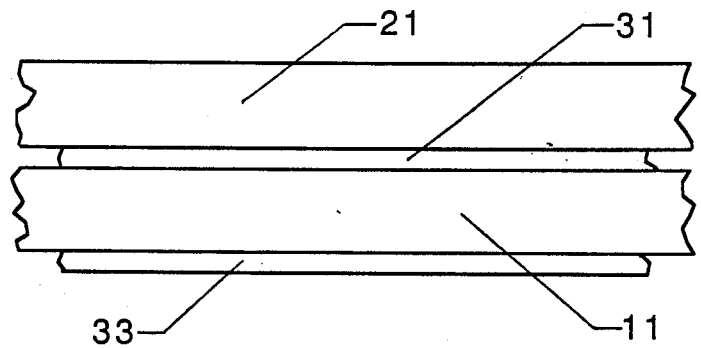
FIG. 3 is a side elevational view of the two-layer strip showing a paper layer having a heat-release adhesive coating bonded to a polyimide layer which is coated on its lower surface with heat-attach adhesive.

Referring now to FIG. 3, backing strip 21 is bonded to polyimide film strip 11 with heat-release coating 31. Heat-attach coating 33 is located on the lower surface of polyimide film strip 11.

Figure 4:
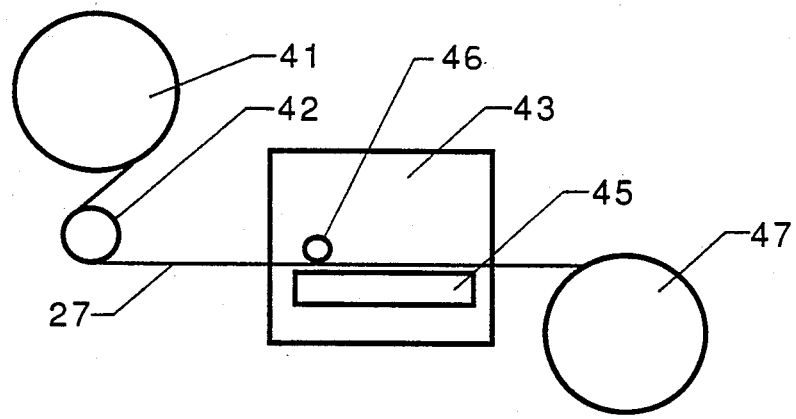
FIG. 4 is a side elevational view of the apparatus used to apply the swatch matrices on the two-layer strip to silicon wafers.

Referring now to FIG. 4, matrix strip 27 is unwound from supply reel 41 by indexed drive roller 42. Matrix strip 27 is then fed through wafer handling machine 43 to take-up reel 44. Drive roller 42 is programmed to stop matrix strip 27 when a matrix of swatches arrives at a predesignated attachment position within the access range of handling machine 43. Moveable chuck 45 removes a heated wafer from a wafer storage cassette and positions the wafer so that the die matrix on the wafer's upper surface is aligned with the arrived swatch matrix. Positioning of the wafer is accomplished with a camera-based optical system by referring to at least two fiduciary marks on the surface of the wafer. With the wafer positioned in close proximity to the swatch matrix attached to matrix strip 27, a roller 46 is brought into contact with the upper surface of matrix strip 27 and rolled across the area to which the arrived swatch matrix is attached. When matrix strip 27 contacts the heated wafer, the heat-attach adhesive on the lower surface of the swatches causes them to adhere to the dies on the wafer. At the same time, the heat-release adhesive on backing strip 21 releases the swatches so that they remain on the dies. Matrix strip 27 is then advanced so that a new swatch matrix is in attachment position. Moveable chuck 45 returns the matrix-protected wafer to a receptacle cassette, then fetches an unprotected wafer which then undergoes the aforementioned matrix application process.

The invention, as described herein, represents only the preferred embodiment of the device. Other embodiments are covered within the scope and spirit of the following claims.

We claim:

1. A process for simultaneously applying a matrix of precut swatches of precured polymer film to each semiconductor die on a silicon wafer comprising the following steps:
   (a) die punching a sheet of precured polymer film, having a heat-attach adhesive on its lower surface, with a first pattern of perforations to remove essentially half of the scrap film material between portions of said sheet which correspond dimensionally to the areas of individual dies on a silicon wafer requiring protective covering;
   (b) creation of a two-layer sandwich by the attachment of a dimensionally-stable backing sheet to the area of said film sheet covered by said first pattern of perforations with heat-release adhesive;
   (c) creation of a matrix of swatches by die punching said two-layer sandwich with a second pattern of perforations to remove the balance of the scrap film material between said portions;
   (d) positioning of said sandwich in a planar configuration;
   (e) positioning of a silicon wafer such that the swatch matrix of said sandwich is aligned directly adjacent to corresponding areas to be covered on said wafer; and
   (f) pressing of said matrix against said wafer in the presence of heat sufficient to cause the heat-attach adhesive on each of the swatches to adhere to its corresponding die on said wafer and to cause the heat-release adhesive on said backing sheet to release said swatches.

2. The process of claim 1, wherein positioning of the silicon wafer is performed by an optically-aligning wafer-handling system.

3. The process of claim 2, wherein optical alignment is accomplished by referring to at least two fiduciary marks on the wafer.

4. The process of claim 1, wherein said polymer film is comprised of polyimide.

5. The process of claim 2, wherein the individual perforations of said first and second perforation patterns are essentially "T" shaped.

6. A process for simultaneously applying a matrix of precut swatches of precured protective film to each semiconductor die on a silicon wafer comprising the following steps:
   (a) indexing a strip of precured protective film, having a heat-attach adhesive on its lower surface, by die punching periodic perforations along each edge;
   (b) die punching said film strip with a series of a first perforation pattern to remove essentially half of the scrap film material between portions of said film strip which correspond dimensionally to the areas of individual dies on a silicon wafer requiring protective covering;
   (c) creation of a two-layer sandwich strip by attaching a dimensionally-stable backing strip to the area of said film strip covered by said series of a first pattern of perforations with heat-release adhesive;
   (d) creation of a series of matrices of swatches on said sandwich strip by die punching said two-layer sandwich strip with a series of a second perforation pattern to remove the balance of the scrap film material between said portions;
   (e) mounting of said sandwich strip on an indexed drive system which serially presents each matrix on said sandwich strip, in planar configuration, to an attachment location within a wafer-handling system;

(f) positioning of a silicon wafer by the wafer-handling system such that a presented swatch matrix on said sandwich strip is aligned directly adjacent to corresponding areas to be covered on said wafer; and (g) pressing of said matrix against said wafer in the presence of heat sufficient to cause the heat-attach adhesive on each of the swatches to adhere to its corresponding die on said wafer and to cause the heat-release adhesive on said backing strip to release said swatches.

7. The process of claim 6, wherein positioning of the silicon wafer by the wafer-handling system is accomplished optically in reference to at least two fiduciary marks on the wafer.

8. The process of claim 6, wherein the protective film is comprised of polyimide.

9. The process of claim 6, wherein said backing strip is wound onto a take-up reel as matrices of swatches are removed and the strip is advanced.

10. The process of claim 6, wherein said indexed drive comprises at least one roller having pins which mesh with said periodic perforations on both edges of said film strip.

11. The process of claim 6, wherein said two-layer sandwich strip is windably removed by said indexed drive from a supply reel.

12. The process of claim 6, wherein the individual perforations of said first and second perforation patterns are essentially "T" shaped.

* * * * *